(12) United States Patent
Akada

(10) Patent No.: US 10,748,885 B2
(45) Date of Patent: Aug. 18, 2020

(54) SEMICONDUCTOR DEVICE AND METHOD FOR MANUFACTURING SEMICONDUCTOR DEVICE

(71) Applicant: Toshiba Memory Corporation, Tokyo (JP)

(72) Inventor: Yusuke Akada, Yokohama Kanagawa (JP)

(73) Assignee: TOSHIBA MEMORY CORPORATION, Tokyo (JP)

(*) Notice: Subject to any disclaimer, the term of this patent is extended or adjusted under 35 U.S.C. 154(b) by 0 days.

(21) Appl. No.: 16/273,859

(22) Filed: Feb. 12, 2019

(65) Prior Publication Data

US 2020/0105734 A1 Apr. 2, 2020

(30) Foreign Application Priority Data

Sep. 28, 2018 (JP) .................. 2018-184646

(51) Int. Cl.
| | | |
|---|---|---|
| H01L 25/18 | (2006.01) | |
| H01L 25/00 | (2006.01) | |
| H01L 21/78 | (2006.01) | |
| H01L 23/00 | (2006.01) | |

(52) U.S. Cl.
CPC .............. *H01L 25/18* (2013.01); *H01L 21/78* (2013.01); *H01L 24/48* (2013.01); *H01L 24/49* (2013.01); *H01L 24/73* (2013.01); *H01L 25/50* (2013.01); *H01L 2224/48091* (2013.01); *H01L 2224/48106* (2013.01); *H01L 2224/48145* (2013.01); *H01L 2224/48227* (2013.01); *H01L 2224/49109* (2013.01); *H01L 2224/49112* (2013.01);

(Continued)

(58) Field of Classification Search
CPC ......... H01L 21/78; H01L 24/48; H01L 24/49; H01L 24/73; H01L 25/18; H01L 25/50; H01L 2224/48091; H01L 2224/48106; H01L 2224/48145; H01L 2224/48227; H01L 2224/49109; H01L 2224/49112; H01L 2224/49175; H01L 2224/73265
See application file for complete search history.

(56) References Cited

U.S. PATENT DOCUMENTS 6,977,439 B2 * 12/2005 Kang ................... H01L 24/85
                                                          257/686
9,773,766 B2     9/2017 Ye et al.
(Continued)

FOREIGN PATENT DOCUMENTS

| JP | 2009026843 A | 2/2009 |
| JP | 2015176906 A | 10/2015 |
| JP | 2017054879 A | 3/2017 |

*Primary Examiner* — Allan R Wilson
(74) *Attorney, Agent, or Firm* — Kim & Stewart LLP

(57) ABSTRACT

According to one embodiment, a semiconductor device comprises a first terminal on a first surface of a substrate and a first semiconductor chip on the first surface of the substrate and including a second terminal. A first connector electrically connects the first terminal to the second terminal. A second semiconductor chip is on the first surface of the substrate. An adhesive resin is between the second semiconductor chip and the first surface. A portion of the first connector is embedded in the adhesive resin. The first semiconductor chip is spaced from the adhesive resin in a direction parallel to the first surface.

17 Claims, 7 Drawing Sheets

(52) U.S. Cl.
 CPC ............... *H01L 2224/49175* (2013.01); *H01L 2224/73265* (2013.01)

(56) References Cited

U.S. PATENT DOCUMENTS

| | | | |
|---|---|---|---|
| 2005/0110128 A1* | 5/2005 | Ahn | H01L 23/49575 257/686 |
| 2007/0102798 A1* | 5/2007 | Nishizawa | G06K 19/07 257/679 |
| 2008/0128880 A1* | 6/2008 | Takiar | H01L 24/32 257/686 |
| 2011/0115100 A1* | 5/2011 | Okumura | H01L 24/49 257/782 |
| 2012/0286411 A1* | 11/2012 | Watanabe | H01L 21/561 257/676 |
| 2016/0005696 A1* | 1/2016 | Tomohiro | H01L 24/97 257/777 |
| 2017/0040291 A1* | 2/2017 | Choi | H01L 24/49 |

\* cited by examiner

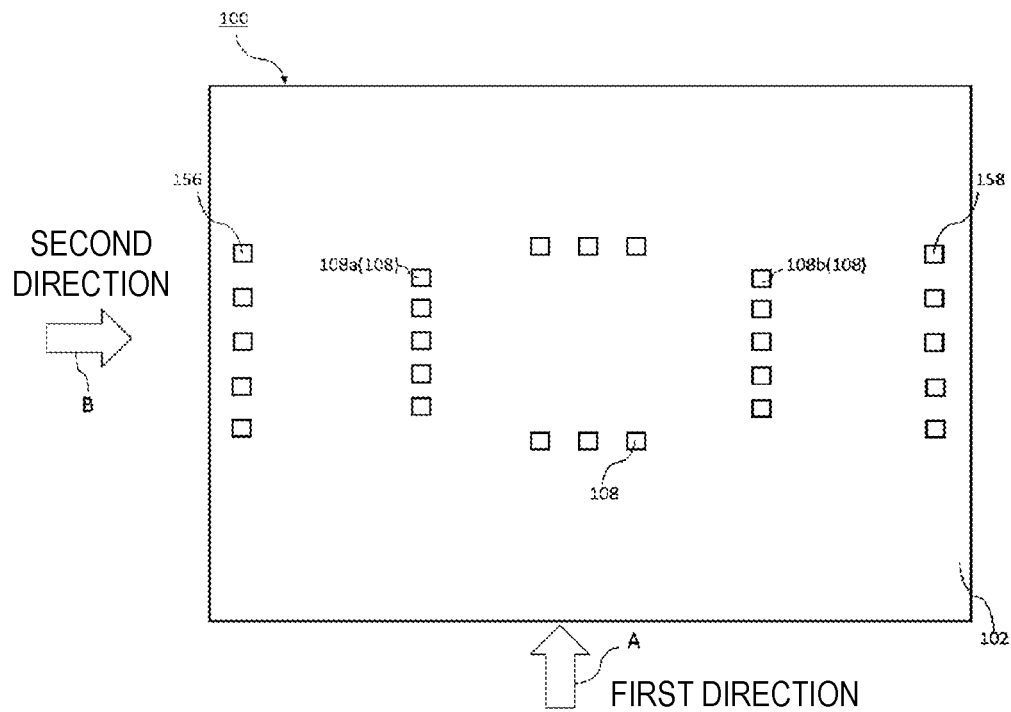
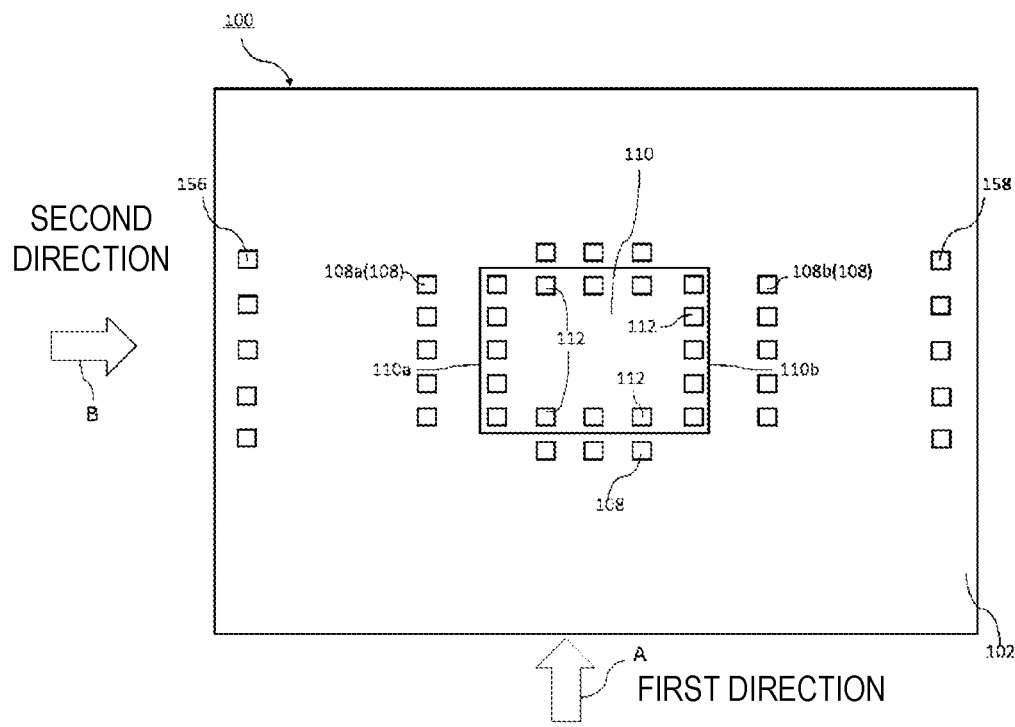

SEMICONDUCTOR DEVICE AND METHOD FOR MANUFACTURING SEMICONDUCTOR DEVICE

CROSS-REFERENCE TO RELATED APPLICATION

This application is based upon and claims the benefit of priority from Japanese Patent Application No. 2018-184646, filed Sep. 28, 2018, the entire contents of which are incorporated herein by reference.

FIELD

Embodiments described herein relate generally to a semiconductor device and a method for manufacturing a semiconductor device.

BACKGROUND

Semiconductor devices are continually decreasing in size in accordance with on-going development of communication and information processing technologies. For example, for semiconductor devices such as a NAND type flash memory, there is a three-dimensional packaging structure in which a controller chip and a memory chip are stacked on the same wiring substrate. Film-on-die (FOD) package structures are known in which a controller chip is covered by an adhesive resin such as a die-attached film (DAF) and a memory chip is also stacked on the adhesive resin. A structure in which a memory chip is stacked using a silicon spacer is also known.

DESCRIPTION OF THE DRAWINGS

FIGS. 4-9 are a schematic top plan views illustrating aspects of a method for manufacturing a semiconductor device according to a first embodiment.

DETAILED DESCRIPTION

Figure 1:
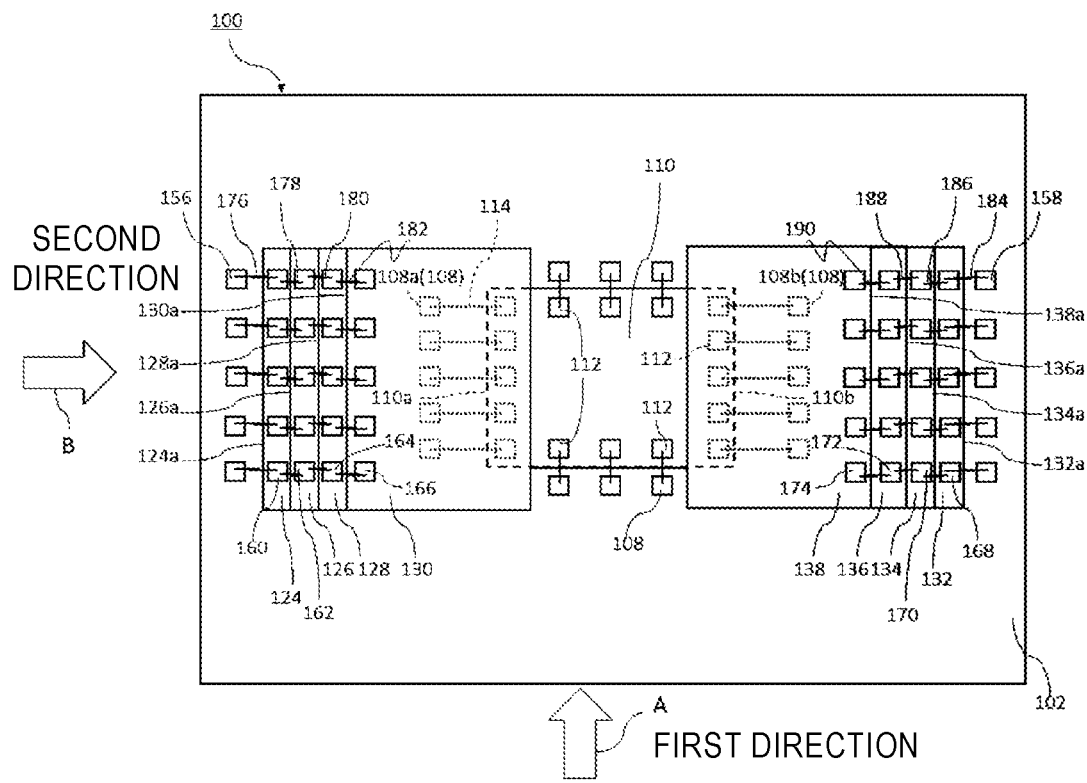
FIG. 1 is a schematic top plan view of a semiconductor device according to a first embodiment.

Example embodiments include a semiconductor device and a method for manufacturing a semiconductor device which permit a reduction in size and thickness of semiconductor devices.

In general, according to one embodiment, a semiconductor device comprises a first terminal on a first surface of a substrate and a first semiconductor chip on the first surface and including a second terminal. A first connector electrically connects the first terminal to the second terminal. A second semiconductor chip is on the first surface of the substrate. An adhesive resin is between the second semiconductor chip and the first surface. A portion of the first connector is embedded in the adhesive resin. The first semiconductor chip is spaced from the adhesive resin in a direction parallel to the first surface.

Hereinafter, certain example semiconductor devices and manufacturing methods according to embodiments of the present disclosure will be described with reference to the drawings. The drawings are schematic, and depicted relationships between thicknesses and other dimensions, ratios of the thicknesses of respective layers, and the like are sometimes different from relationships and ratios in actual implementations. In addition, in the depicted example embodiments, substantially identical constituent elements are denoted by the same reference numerals, and descriptions thereof will be omitted as appropriate.

First Embodiment

Figure 2:
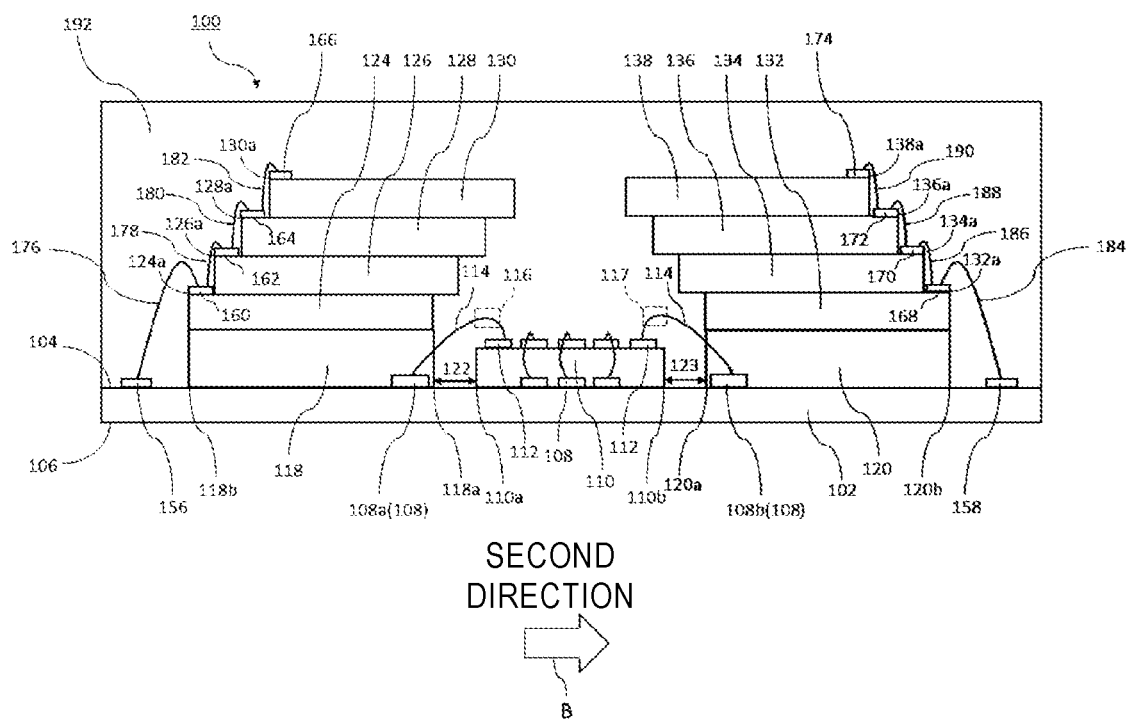
FIG. 2 is a schematic side view of a semiconductor device according to a first embodiment.

A configuration of a semiconductor device 100 according to a first embodiment will be described with reference to FIGS. 1 and 2. FIG. 1 is a schematic top plan view of a semiconductor device 100. FIG. 2 is a side view of the semiconductor device 100 as viewed in the direction of arrow A illustrated in FIG. 1. Arrow B is in a direction approximately perpendicular to arrow A. The direction of arrow A is referred to as the first direction, and the direction of arrow B is referred to as the second direction.

The semiconductor device 100 has a substrate 102, a first semiconductor chip 110, first connectors 114, adhesive resin 118, adhesive resin 120, and second semiconductor chips (semiconductor chip 124, semiconductor chip 126, semiconductor chip 128, semiconductor chip 130, semiconductor chip 132, semiconductor chip 134, semiconductor chip 136, and semiconductor chip 138). This configuration is embedded in a molded resin 192 (see FIG. 2). However, in FIG. 1, the molded resin 192 is omitted to enable easier explanation.

A wiring layer is in the substrate 102, to electrically connect a first surface 104 of the substrate 102 and a second surface 106 of the substrate 102. A bump can be formed on the second surface 106 as an external connecting terminal, and may be used to electrically connect the semiconductor device 100 with the outside.

The direction going from the second surface 106 toward the first surface 104 is referred to as an upward direction, and the direction opposite to the upward direction is referred to as a downward direction.

In this example, the substrate 102 has an approximately rectangular plate shape (see FIG. 1).

First terminals 108, which are electrically connected to the first semiconductor chip 110, are provided on the first surface 104 of the substrate 102.

The first terminals 108 are provided along the perimeter of the first semiconductor chip 110.

The first terminals 108 include first terminals 108a and first terminals 108b which are arranged in lines along the first direction.

The first terminals 108a are disposed to a first side of the first semiconductor chip 110, and the first terminals 108b are disposed to a second side of the first semiconductor chip 110 opposite the first side in the second direction.

The first terminal 108 is formed by a method such as printing, chemical vapor deposition, sputtering, or plating, using metal such as copper, gold, or alloys of these metals.

Third terminals 156 are electrically connected to certain second semiconductor chips (semiconductor chips 124, 126, 128, 130), and third terminals 158 are electrically connected to the other second semiconductor chips (semiconductor chips 132, 134, 136, 138) to be described below, are provided on the first surface 104 of the substrate 102.

The third terminals 156 are arranged along the first direction.

The third terminals 156 are disposed to be closer to the front side of the substrate 102 in the second direction than the first terminals 108a.

The third terminal 156 is formed by a method such as printing, chemical vapor deposition, sputtering, or plating by using metal such as copper, gold, or alloys of these metals.

The third terminals 158 are arranged along the first direction.

The third terminals 158 are disposed to be closer to the rear side of the substrate 102 in the second direction than the first terminals 108b.

The third terminal 158 is formed by a method such as printing, chemical vapor deposition, sputtering, or plating by using metal such as copper, gold, or alloys of these metals.

The first terminals 108, the third terminals 156, and the third terminals 158 pass from the first surface 104 of the substrate 102 through the wiring layer in the substrate 102 to electrically connect to a pad provided on the second surface 106.

The first semiconductor chip 110 is, for example, a controller chip, an interface chip, or the like of a semiconductor storage device.

The first semiconductor chip 110 has an approximately quadrangular plate shape and is provided to be surrounded by the first terminals 108 on the first surface 104 of the substrate 102.

A not-shown adhesive resin is provided between the first semiconductor chip 110 and the substrate 102.

The first semiconductor chip 110 is fixed to the substrate 102 by the adhesive resin.

Second terminals 112 are provided on an outer circumferential portion of the front surface of the first semiconductor chip 110 at positions corresponding to the first terminals 108.

The second terminal 112 is formed by a method such as printing, chemical vapor deposition, sputtering, or plating by using metal such as aluminum, copper, an alloy of aluminum and copper, and/or gold.

The first connector 114 is an electrically conductive arc-shaped bonding wire and electrically connects the second terminal 112 and its corresponding first terminal 108.

The highest points 116 and 117 in the arcs of the first connectors 114 are located inward from the outer circumference of the first semiconductor chip 110 when viewed from above.

A metal wire (e.g., a gold (Au) wire or a copper (Cu) wire) having a wire diameter of about 25 μm is used as the first connector 114.

The adhesive resins 118 and 120 are provided such that their lower surfaces are in direct contact with the first surface 104 of the substrate 102.

The adhesive resins 118 and 120 include an adhesive resin 118 which is provided to be closer to the front side in the second direction than the first semiconductor chip 110, and an adhesive resin 120 which is provided to be closer to the rear side than the first semiconductor chip 110.

The adhesive resin 118 has a quadrangular plate shape and is provided such that one side 118a, which is closest to the first semiconductor chip 110, is approximately in parallel with one side 110a of the first semiconductor chip 110.

The adhesive resin 120 has a quadrangular plate shape and is provided such that one side 120a, which is closest to the first semiconductor chip 110, is approximately in parallel with one side 110b of the first semiconductor chip 110.

The adhesive resins 118 and 120 are provided such that gaps 122 and 123 are formed between the adhesive resins 118 and 120 and the first semiconductor chip 110. The gaps 122 and 123 preferably have small sizes as long as they can be filled with the molded resin 192. The sizes of the gaps 122 and 123 are preferably 20 μm or more to make it unlikely that the gaps 122 and 123 cannot be filled with the molded resin 192.

The adhesive resins 118 and 120 may be, for example, DAF having a thickness of about 60 μm and may be approximately equal in thickness to the first semiconductor chip 110, thicker or thinner by about 10 to 20 μm.

The first embodiment shows a case in which the thicknesses of the adhesive resins 118 and 120 are smaller than the height of highest points of the arcs 116 and 117. In addition, the thicknesses of the adhesive resins 118 and 120 may be greater or smaller than the height of the highest points of the arcs 116 and 117.

The adhesive resin 118 covers all of the first terminals 108a, and the first connectors 114 are partially embedded in the adhesive resin 118. The adhesive resin 118 is provided such that side 118b, which faces one side 118a, is disposed to be closer to the rear side in the second direction than the third terminal 156.

The adhesive resin 120 covers all of the first terminals 108b and part of the first connectors 114 are embedded in the adhesive resin 120. The adhesive resin 120 is provided such that side 120b, which faces one side 120a, is disposed to be closer to the front side in the second direction than the third terminal 158.

The first embodiment shows a case in which the highest points of the arcs 116 and 117 are not embedded in the adhesive resins 118 and 120. Further, the highest points of the arcs 116 and 117 may or may not be embedded in the adhesive resins 118 and 120.

The second semiconductor chip 124 is, for example, a memory chip having a storage element such as a NAND type flash memory.

The second semiconductor chip 124 has an approximately quadrangular plate shape.

The second semiconductor chip 124 is provided in contact with an upper surface of the adhesive resin 118 so that the second semiconductor chip 124 is approximately identical in external shape to the adhesive resin 118 when viewed from above.

Fourth terminals 160, which are arranged along the first direction, are provided on the outer circumferential portion of one side 124a of the second semiconductor chip 124.

The fourth terminals 160 are formed by a method such as printing, chemical vapor deposition, sputtering, or plating by using metal such as aluminum, copper, an alloy of aluminum and copper, and/or gold.

The second semiconductor chip 126 is, for example, a memory chip having a storage element such as a NAND type flash memory.

The second semiconductor chip 126 has an approximately quadrangular plate shape.

The second semiconductor chip 126 is provided on the second semiconductor chip 124.

A not-shown adhesive resin is provided between the second semiconductor chip 126 and the second semiconductor chip 124, and the second semiconductor chip 126 is fixed to the second semiconductor chip 124 by the adhesive resin.

The second semiconductor chip 126 is provided to be shifted in the second direction from the second semiconductor chip 124 so as not to cover the fourth terminals 160.

That is, the second semiconductor chip 124 and the second semiconductor chip 126 define a stepped shape.

Fourth terminals 162, which are arranged along the first direction, are provided on the outer circumferential portion of one side 126a of the second semiconductor chip 126.

The fourth terminals 162 are formed by a method such as printing, chemical vapor deposition, sputtering, or plating by using metal such as aluminum, copper, an alloy of aluminum and copper, and/or gold.

The second semiconductor chip 128 is, for example, a memory chip having a storage element such as a NAND type flash memory.

The second semiconductor chip 128 has an approximately quadrangular plate shape.

The second semiconductor chip 128 is provided on the second semiconductor chip 126.

A not-shown adhesive resin is provided between the second semiconductor chip 128 and the second semiconductor chip 126, and the second semiconductor chip 128 is fixed to the second semiconductor chip 126 by the adhesive resin.

The second semiconductor chip 128 is provided to be shifted in the second direction from the second semiconductor chip 126 so as not to cover the fourth terminals 162.

That is, the second semiconductor chip 126 and the second semiconductor chip 128 define a stepped shape.

Fourth terminals 164, which are arranged along the first direction, are provided on the outer circumferential portion of one side 128a of the second semiconductor chip 128.

The fourth terminals 164 are formed by a method such as printing, chemical vapor deposition, sputtering, or plating by using metal such as aluminum, copper, an alloy of aluminum and copper, and/or gold.

The second semiconductor chip 130 is, for example, a memory chip having a storage element such as a NAND type flash memory.

The second semiconductor chip 130 has an approximately quadrangular plate shape.

The second semiconductor chip 130 is provided on the second semiconductor chip 128.

A not-shown adhesive resin is provided between the second semiconductor chip 130 and the second semiconductor chip 128, and the second semiconductor chip 130 is fixed to the second semiconductor chip 128 by the adhesive resin.

The second semiconductor chip 130 is provided to be shifted in the second direction from the second semiconductor chip 128 so as not to cover the fourth terminals 164.

Then, the second semiconductor chip 130, which is uppermost of the stacked second semiconductor chips, overlaps the second terminals 112 when viewed from above.

That is, the second semiconductor chip 128 and the second semiconductor chip 130 define a stepped shape.

Fourth terminals 166, which are arranged along the first direction, are provided on the outer circumferential portion of one side 130a of the second semiconductor chip 130.

The fourth terminals 166 are formed by a method such as printing, chemical vapor deposition, sputtering, or plating by using metal such as aluminum, copper, an alloy of aluminum and copper, and/or gold.

The second semiconductor chip 132 is, for example, a memory chip having a storage element such as a NAND type flash memory.

The second semiconductor chip 132 has an approximately quadrangular plate shape.

The second semiconductor chip 132 is provided in contact with an upper surface of the adhesive resin 120 so that the second semiconductor chip 132 is approximately identical in external shape to the adhesive resin 120 when viewed from above.

Fourth terminals 168, which are arranged along the first direction, are provided on the outer circumferential portion of one side 132a of the second semiconductor chip 132.

The fourth terminals 168 are formed by a method such as printing, chemical vapor deposition, sputtering, or plating by using metal such as aluminum, copper, an alloy of aluminum and copper, and/or gold.

The second semiconductor chip 134 is, for example, a memory chip having a storage element such as a NAND type flash memory.

The second semiconductor chip 134 has an approximately quadrangular plate shape.

The second semiconductor chip 134 is provided on the second semiconductor chip 132.

A not-shown adhesive resin is provided between the second semiconductor chip 134 and the second semiconductor chip 132, and the second semiconductor chip 134 is fixed to the second semiconductor chip 132 by the adhesive resin.

The second semiconductor chip 134 is provided to be shifted in a direction opposite to the second direction from the second semiconductor chip 132 so as not to cover the fourth terminals 168.

That is, the second semiconductor chip 132 and the second semiconductor chip 134 define a stepped shape.

Fourth terminals 170, which are arranged along the first direction, are provided on the outer circumferential portion of one side 134a of the second semiconductor chip 134.

The fourth terminal 170 is formed by a method such as printing, chemical vapor deposition, sputtering, or plating by using metal such as aluminum, copper, an alloy of aluminum and copper, and/or gold.

The second semiconductor chip 136 is, for example, a memory chip having a storage element such as a NAND type flash memory.

The second semiconductor chip 136 has an approximately quadrangular plate shape.

The second semiconductor chip 136 is provided on the second semiconductor chip 134.

A not-shown adhesive resin is provided between the second semiconductor chip 136 and the second semiconductor chip 134, and the second semiconductor chip 136 is fixed to the second semiconductor chip 134 by the adhesive resin.

The second semiconductor chip 136 is provided to be shifted in the direction opposite to the second direction from the second semiconductor chip 134 so as not to cover the fourth terminals 170.

That is, the second semiconductor chip 134 and the second semiconductor chip 136 define a stepped shape.

Fourth terminals 172, which are arranged along the first direction, are provided on the outer circumferential portion of one side 136a of the second semiconductor chip 136.

The fourth terminal 172 is formed by a method such as printing, chemical vapor deposition, sputtering, or plating by using metal such as aluminum, copper, an alloy of aluminum and copper, and/or gold.

The second semiconductor chip 138 is, for example, a memory chip having a storage element such as a NAND type flash memory.

The second semiconductor chip 138 has an approximately quadrangular plate shape.

The second semiconductor chip 138 is provided on the second semiconductor chip 136.

A not-shown adhesive resin is provided between the second semiconductor chip 138 and the second semiconductor chip 136, and the second semiconductor chip 138 is fixed to the second semiconductor chip 136 by the adhesive resin.

The second semiconductor chip 138 is provided to be shifted in the direction opposite to the second direction from the second semiconductor chip 136 so as not to cover the fourth terminals 172.

Then, the second semiconductor chip 138, which is uppermost of the stacked second semiconductor chips, overlaps the second terminals 112 when viewed from above.

That is, the second semiconductor chip 136 and the second semiconductor chip 138 define a stepped shape.

Fourth terminals 174, which are arranged along the first direction, are provided on the outer circumferential portion of one side 138a of the second semiconductor chip 138.

The fourth terminal 174 is formed by a method such as printing, chemical vapor deposition, sputtering, or plating by using metal such as aluminum, copper, an alloy of aluminum and copper, and/or gold.

The second semiconductor chips (semiconductor chips 124, 126, 128, 130, 132, 134, 136, 138) may further have decoders and the like in addition to the memory cells. In the case in which the memory chips are used as the second semiconductor chips, writing and reading of data on the memory chips may be controlled using a controller with respect to the first semiconductor chip 110.

The second connectors (connectors 176, 178, 180, 182, 184, 186, 188, 190) are electrically conductive bonding wires. Certain second connectors (connectors 176, 178, 180, 182) electrically connect the third terminals 156 with certain fourth terminals (terminals 160, 162, 164, 166). Other second connectors (connectors 184, 186, 188, 190) electrically connect the third terminals 158 with certain fourth terminals (terminals 168, 170, 172, 174. A metal wire, such as a gold (Au) wire or a copper (Cu) wire, having a wire diameter of about 25 μm is used for each of the second connectors (connectors 176, 178, 180, 182, 184, 186, 188, 190).

The second connector 176 electrically connects the third terminal 156 and the fourth terminal 160.

The second connector 178 electrically connects the fourth terminal 160 and the fourth terminal 162.

The second connector 180 electrically connects the fourth terminal 162 and the fourth terminal 164.

The second connector 182 electrically connects the fourth terminal 164 and the fourth terminal 166.

The second connector 184 electrically connects the third terminal 158 and the fourth terminal 168.

The second connector 186 electrically connects the fourth terminal 168 and the fourth terminal 170.

The second connector 188 electrically connects the fourth terminal 170 and the fourth terminal 172.

The second connector 190 electrically connects the fourth terminal 172 and the fourth terminal 174.

The molded resin 192 is provided to seal the substrate 102, the first semiconductor chip 110, the adhesive resins 118 and 120, and the second semiconductor chips (124, 126, 128, 130, 132, 134, 136, 138).

Semiconductor Device According to First Embodiment Effects

A case in which adhesive resin is provided to cover the first semiconductor chip 110 will be described as a first comparative example. In this case, the adhesive resin will increase in thickness to the extent of the thickness of the first semiconductor chip 110. In a case in which the second semiconductor chips 124 and 132 are stacked on the adhesive resin, these second semiconductor chips 124 and 132 cannot be stacked well on the adhesive resin because the adhesive resin over the first semiconductor chip swells and becomes locally too thick. For this reason, it is necessary to use an adhesive resin which is substantially thicker (by about 120 to 135 μm) than the first semiconductor chip 110, and it is generally necessary to flatten the upper surface of the adhesive resin by using a spacer, made of silicon (Si) or the like, on the upper surface of the adhesive resin. In this comparative case, the thickness of the semiconductor device thus cannot be reduced, and a cost of the spacer is an added burden.

A case in which adhesive resin is provided at a position that is spaced apart from the first terminal 108 in the second direction so as not to cover any part of the first connector 114 will be described as a second comparative example. In this second case, the size of the semiconductor device can be reduced in the thickness direction but cannot be reduced in the second direction (e.g., a planar width direction).

However, in the first embodiment, the adhesive resins 118 and 120 may be approximately equal in thickness (+/− about 10 to 20 μm) to the first semiconductor chip 110 with the gap 122 and the gap 123 being formed respectively between the adhesive resin 118 and the first semiconductor chip 110 and the adhesive resin 120 and the first semiconductor chip 110. The adhesive resins 118 and 120 are also provided such as to cover some part of each of the first connectors 114.

Therefore, according to the semiconductor device 100 according to the first embodiment, the thickness of the semiconductor device 100 may be reduced in comparison with the first comparative example by at least the extent of the difference between the thickness of the spacer and the thin adhesive resin. Further, it is possible to avoid the added cost of including the spacer from being incurred.

In the semiconductor device 100, the adhesive resins 118 and 120 are adjacent to the first semiconductor chip 110 and so the size of the semiconductor device 100 may be reduced in the second direction in comparison with the second comparative example.

Further, if the adhesive resins 118 and 120 become somewhat thicker, then the second semiconductor chips 124 and 132 can be made adjacent to the first semiconductor chip 110 such that the lower surfaces of the second semiconductor chips 124 and 132 are not in contact with the first connectors 114. The adhesive resins 118 and 120 may be approximately equal in thickness to the first semiconductor chip 110 or thicker by about 10 to 20 μm, but the present disclosure is not limited thereto, and the adhesive resins 118 and 120 may instead be thinner than the first semiconductor chip 110. In this case, this configuration is suitable for a reduction in device thickness.

Method for Manufacturing Semiconductor Device According to First Embodiment

Figure 3:
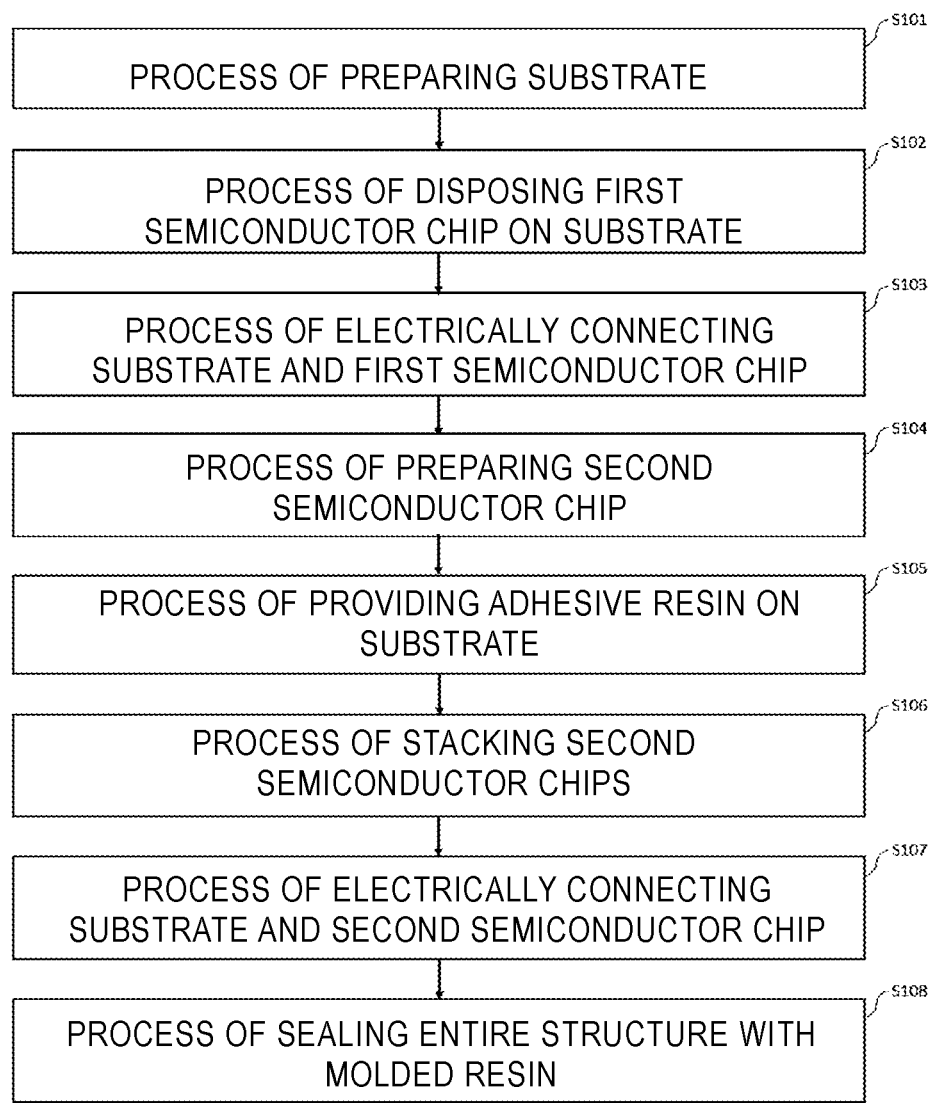
FIG. 3 is a flowchart illustrating aspects of a method for manufacturing a semiconductor device according to a first embodiment.

Next, a method for manufacturing the semiconductor device 100 according to the first embodiment will be described with reference to FIGS. 3 to 10. FIG. 3 is an overall flowchart for the manufacturing of the semiconductor device 100. FIGS. 4 to 9 are schematic top plan views illustrating aspects of the method for manufacturing the semiconductor device 100. FIG. 10 is a flowchart illustrating aspects related to a wafer processing relevant in to the manufacture of the semiconductor device 100.

(Step S101: Process of Preparing Substrate)

As illustrated in FIG. 4, the substrate 102, which has wires therein and has the first terminals 108 and the third terminals 156 and 158 thereon, is prepared.

(Step S102: Process of Disposing First Semiconductor Chip on Substrate)

As illustrated in FIG. 5, the first semiconductor chip 110 is disposed on the first surface 104 of the substrate 102 and attached thereto by an adhesive (not specifically shown). In this case, the adhesive is applied to the first surface 104 in a state in which viscosity is low (perhaps due to heating or the like). Thereafter, the viscosity of this adhesive returns to a high viscosity or solid state (upon cooling or the like) and the first semiconductor chip 110 is fixed to the first surface 104 of the substrate 102.

(Step S103: Process of Electrically Connecting Substrate and First Semiconductor Chip)

Figure 6:
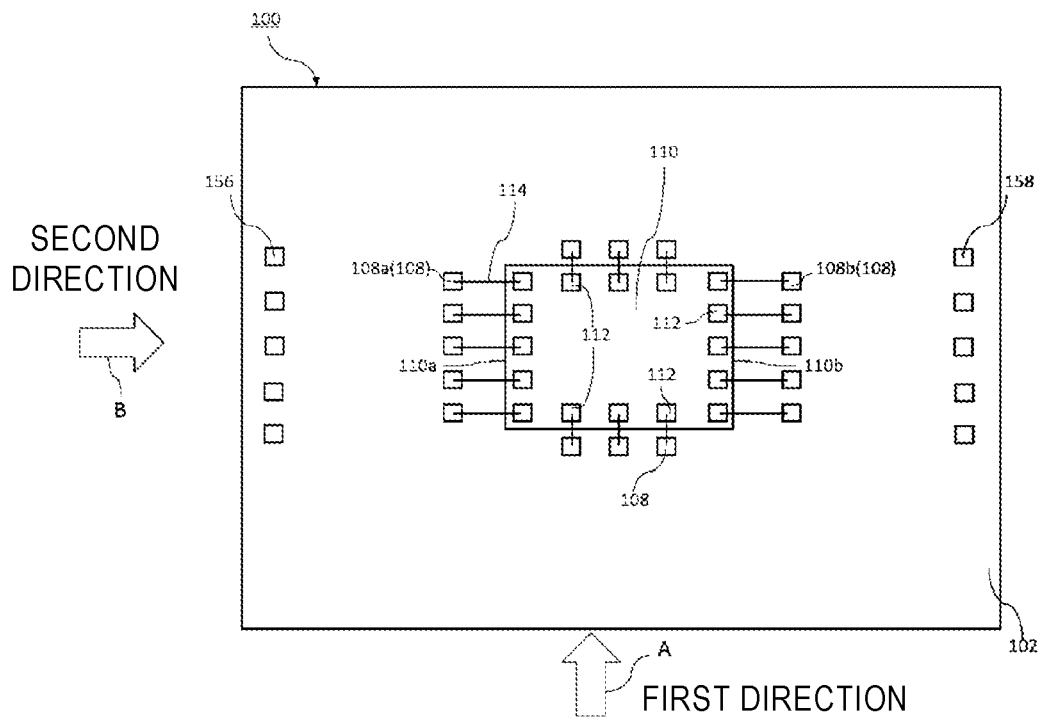

As illustrated in FIG. 6, the first connectors 114 are used to electrically connect the second terminals 112 of the first semiconductor chip 110 and the first terminals 108 of the substrate 102. In this case, the highest points of the arc 116 and arc 117 (see FIG. 2) of the first connectors 114 are located inward from the outer circumference of the first semiconductor chip 110 when viewed from above.

(Step S104: Process of Preparing Second Semiconductor Chips)

The second semiconductor chips 124 and 132 are attached to the adhesive resins 118 and 120 by the processes described in conjunction with FIG. 10. First, a protective tape for protecting a surface of a device is attached to a surface of a wafer (S201). Next, a rear surface of the wafer is ground by using a grindstone or the like so that the wafer becomes thin (S202). Next, a dicing tape for attaching the adhesive resins 118 and 120 is attached to the thinned wafer (S203). Thereafter, the protective tape is removed (S204). Next, the wafer to which the adhesive resins 118 and 120 have been attached is diced (S205). With the aforementioned processes, it is possible to prepare the multiple second semiconductor chips, each of which is approximately identical in external shape (outer perimeter) to the adhesive resins when viewed from above (S206).

(Step S105: Process of Providing Adhesive Resin on Substrate)

Figure 7:
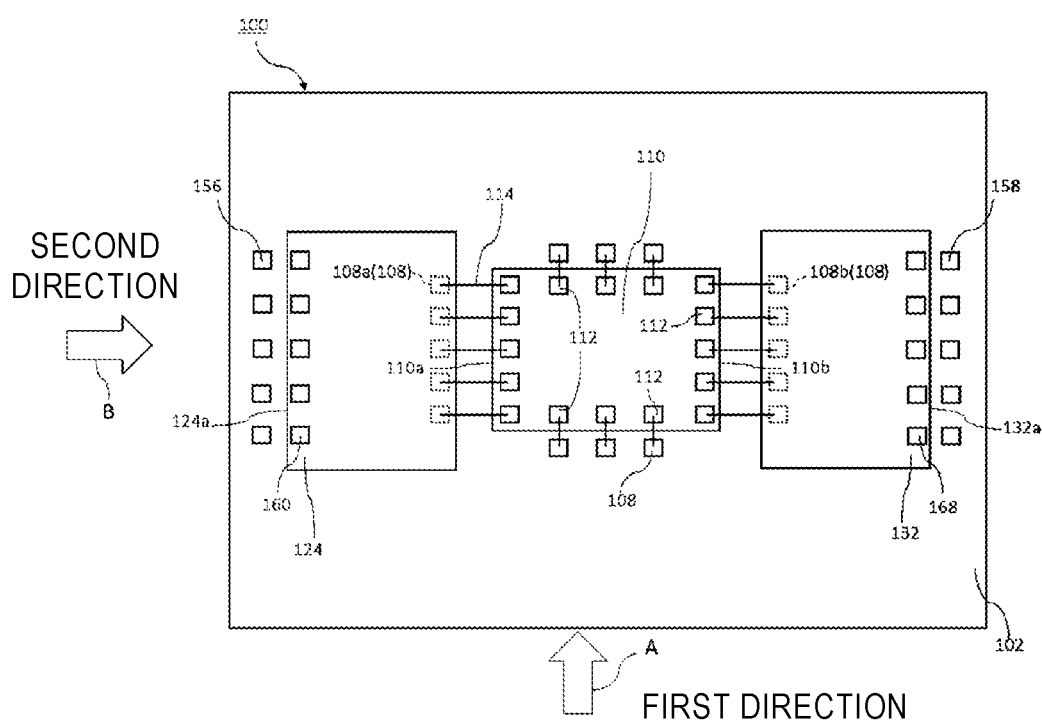

As illustrated in FIG. 7, the adhesive resin 118 holding the second semiconductor chip 124 and the adhesive resin 120 holding the second semiconductor chip 132 are attached to the first surface 104 of the substrate 102 so that a portion of each of the first connectors 114 is embedded therein. In this case, the second semiconductor chips 124 and 132 and the first connectors 114 are disposed so as not to be in contact with one another. The first embodiment explains a case in which the highest points of the arcs 116 and 117 are not embedded in the adhesive resins 118 and 120.

(Step S106: Process of Stacking Second Semiconductor Chips)

Figure 8:
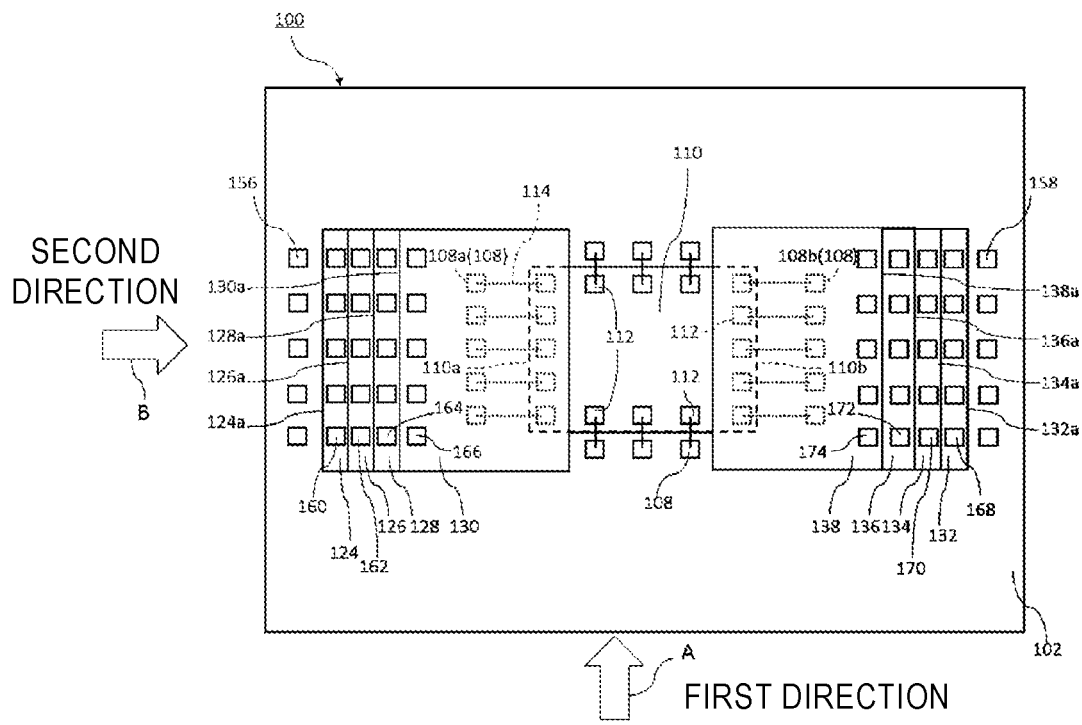

As illustrated in FIG. 8, certain second semiconductor chips (semiconductor chips 126, 128, 130) are stacked by interposing an adhesive resin on the upper surface of the second semiconductor chip 124. Other second semiconductor chips (134, 136, 138 are stacked by interposing an adhesive resin on the upper surface of the second semiconductor chip 132. In this process, the second semiconductor chip 124 is already attached to adhesive resin 118, and the second semiconductor chip 132 is already attached to adhesive resin 120.

(Step S106: Process of Stacking Second Semiconductor Chip 126)

The second semiconductor chip 126 is provided on the second semiconductor chip 124.

As illustrated in FIG. 8, the second semiconductor chip 126 is provided to be shifted in the second direction from the second semiconductor chip 124 so as not to cover the fourth terminals 160.

Adhesive resin is provided between the second semiconductor chip 126 and the second semiconductor chip 124, though this is not specifically depicted in the figures. The adhesive resin is applied to the second semiconductor chip 124 in a state in which viscosity of the adhesive resin is lowered by heating or the like. Thereafter, the viscosity of the adhesive resin increases upon cooling or the like, and as a result, the second semiconductor chip 126 is fixed to the second semiconductor chip 124.

That is, the second semiconductor chip 124 and the second semiconductor chip 126 form a stair-stepped shape.

(Step S106: Process of Stacking Second Semiconductor Chip 128)

The second semiconductor chip 128 is provided on the second semiconductor chip 126.

The second semiconductor chip 128 is shifted in the second direction from the second semiconductor chip 126 so as not to cover the fourth terminals 162.

Adhesive resin is provided between the second semiconductor chip 128 and the second semiconductor chip 126, though this is not specifically depicted in the figures. The adhesive resin is applied to the second semiconductor chip 126 in a state in which viscosity of the adhesive resin is lowered by heating or the like. Thereafter, the viscosity of the adhesive resin increases as the adhesive resin is cooled or the like, and as a result, the second semiconductor chip 128 is fixed to the second semiconductor chip 126.

The second semiconductor chip 126 and the second semiconductor chip 128 define a stair-stepped shape.

(Step S106: Process of Stacking Second Semiconductor Chip 130)

The second semiconductor chip 130 is provided on the second semiconductor chip 128.

The second semiconductor chip 130 is shifted in the second direction from the second semiconductor chip 128 so as not to cover the fourth terminals 164.

Then, the second semiconductor chip 130, which is uppermost of the stacked second semiconductor chips, overlaps the second terminals 112 when viewed from above.

Adhesive resin is provided between the second semiconductor chip 130 and the second semiconductor chip 128, though this is not specifically depicted in the figures. The adhesive resin is applied to the second semiconductor chip 128 in a state in which viscosity of the adhesive resin is lowered by heating or the like. Thereafter, the viscosity of the adhesive resin increases as the adhesive resin is cooled, and as a result, the second semiconductor chip 130 is fixed to the second semiconductor chip 128.

The second semiconductor chip 128 and the second semiconductor chip 130 form a stair-stepped shape.

(Step S106: Process of Stacking Second Semiconductor Chip 134)

The second semiconductor chip 134 is provided on the second semiconductor chip 132.

The second semiconductor chip 134 is shifted from the position of the second semiconductor chip 132 so as not to cover the fourth terminals 168.

Adhesive resin is provided between the second semiconductor chip 134 and the second semiconductor chip 132, though this is not specifically depicted in the figures. The adhesive resin is applied to the second semiconductor chip 132 in a state in which viscosity of the adhesive resin is lowered by heating or the like. Thereafter, the viscosity of the adhesive resin increases upon cooling or the like, and as a result, the second semiconductor chip 134 is fixed to the second semiconductor chip 132.

That is, the second semiconductor chip 132 and the second semiconductor chip 134 form a stair-stepped shape.

(Step S106: Process of Stacking Second Semiconductor Chip 136)

The second semiconductor chip 136 is provided on the second semiconductor chip 134.

The second semiconductor chip 136 is shifted in the direction opposite to the second direction from the position of the second semiconductor chip 134 so as not to cover the fourth terminals 170.

Adhesive resin is provided between the second semiconductor chip 136 and the second semiconductor chip 134, though this is not specifically depicted in the figures. The adhesive resin is applied to the second semiconductor chip 134 in a state in which viscosity of the adhesive resin is lowered by heating or the like. Thereafter, the viscosity of the adhesive resin increases upon cooling or the like, and as a result, the second semiconductor chip 136 is fixed to the second semiconductor chip 134.

That is, the second semiconductor chip 134 and the second semiconductor chip 136 form a stair-stepped shape.

(Step S106: Process of Stacking Second Semiconductor Chip 138)

The second semiconductor chip 138 is provided on the second semiconductor chip 136.

The second semiconductor chip 138 is shifted from the position of the second semiconductor chip 136 so as not to cover the fourth terminals 172.

Then, the second semiconductor chip 138, which is uppermost of the stacked second semiconductor chips, overlaps the second terminals 112 when viewed from above.

Adhesive resin is provided between the second semiconductor chip 138 and the second semiconductor chip 136, though this is not specifically depicted in the figures. The adhesive resin is applied to the second semiconductor chip 136 in a state in which viscosity of the adhesive resin is lowered by heating or the like. Thereafter, the viscosity of the adhesive resin increases upon cooling or the like, and as a result, the second semiconductor chip 138 is fixed to the second semiconductor chip 136.

That is, the second semiconductor chip 136 and the second semiconductor chip 138 form a stair-stepped shape.

(Step S107: Process of Electrically Connecting Substrate and Second Semiconductor Chips)

Figure 9:
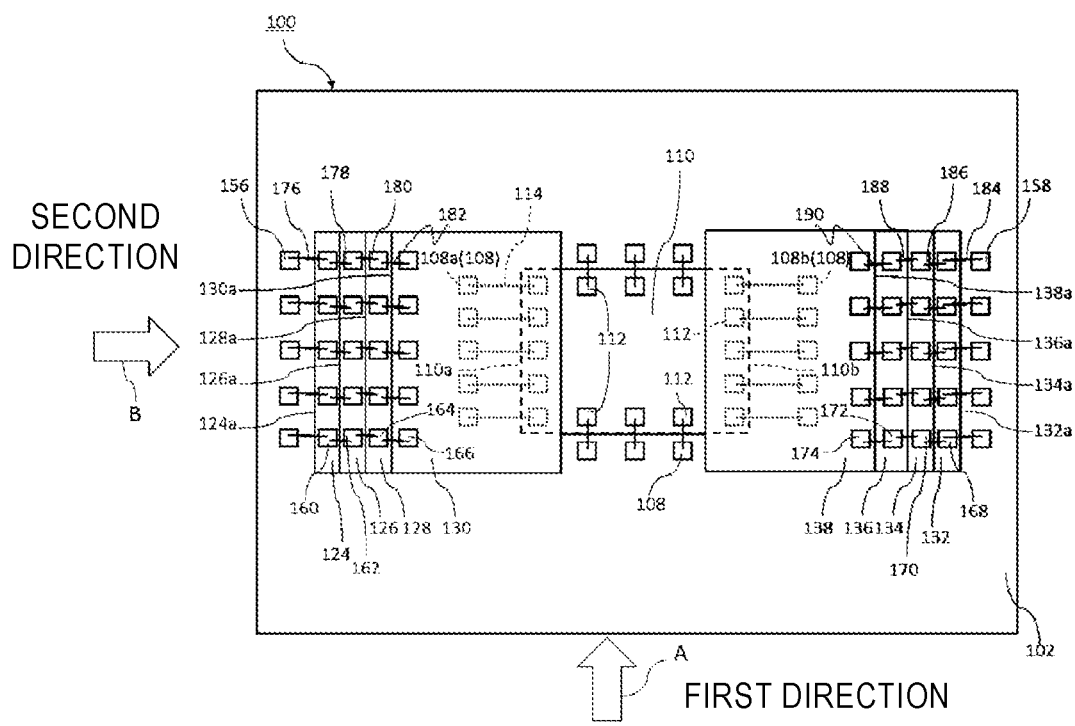
Figure 10:
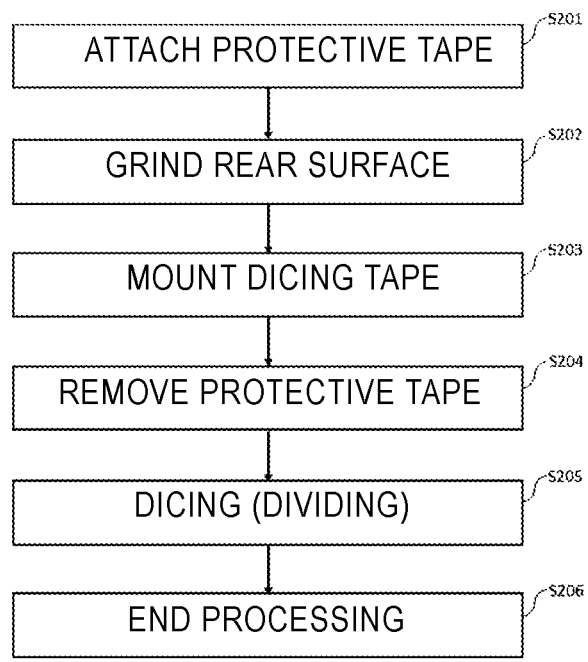
FIG. 10 is a flowchart illustrating aspects of a processing of a wafer related to a semiconductor device according to a first embodiment.

As illustrated in FIG. 9, the substrate 102 and the second semiconductor chips (semiconductor chips 124, 126, 128, 130, 132, 134, 136, 138 are electrically connected by using the second connectors (connectors 176, 178, 180, 182, 184, 186, 188 190).

The second connector 176 electrically connects the third terminal 156 and the fourth terminal 160.

The second connector 178 electrically connects the fourth terminal 160 and the fourth terminal 162.

The second connector 180 electrically connects the fourth terminal 162 and the fourth terminal 164.

The second connector 182 electrically connects the fourth terminal 164 and the fourth terminal 166.

The second connector 184 electrically connects the third terminal 158 and the fourth terminal 168.

The second connector 186 electrically connects the fourth terminal 168 and the fourth terminal 170.

The second connector 188 electrically connects the fourth terminal 170 and the fourth terminal 172.

The second connector 190 electrically connects the fourth terminal 172 and the fourth terminal 174.

(Step S108: Process of Sealing Entire Configuration by Molded Resin)

Next, the entire configuration is embedded in the molded resin 192. The molded resin 192 is an insulating resin such as an epoxy resin and is formed by a molding method such as a transfer molding method, a compression molding method, or an injection molding method. With the aforementioned processes, the semiconductor device 100 according to the first embodiment is manufactured.

A manufacturing method according to the present disclosure includes no process of attaching a spacer, and as a result, a semiconductor device according to the first embodiment has a reduced cost in comparison to the first comparative example.

In addition, adhesive resin and semiconductor chips may be processed to have the same size, and as a result, the adhesive resin and semiconductor chips are easily handled.

Further, the connectors are partially embedded in an adhesive resin prior to the embedding in molded resin, and as a result, it is possible to prevent the connectors from being disconnected, bent, and/or damaged during the molding process.

Second Embodiment

A semiconductor device 200 according to a second embodiment is almost the same as the semiconductor device 100 according to the first embodiment, but the semiconductor device 200 is different from the semiconductor device 100 in that highest points of the arcs 216 and 217 of first connectors 214 are located outside the outer circumference of the first semiconductor chip 110 as viewed from above, and the highest points of the arcs 216 and 217 are embedded in adhesive resins 218 and 220.

Figure 11:
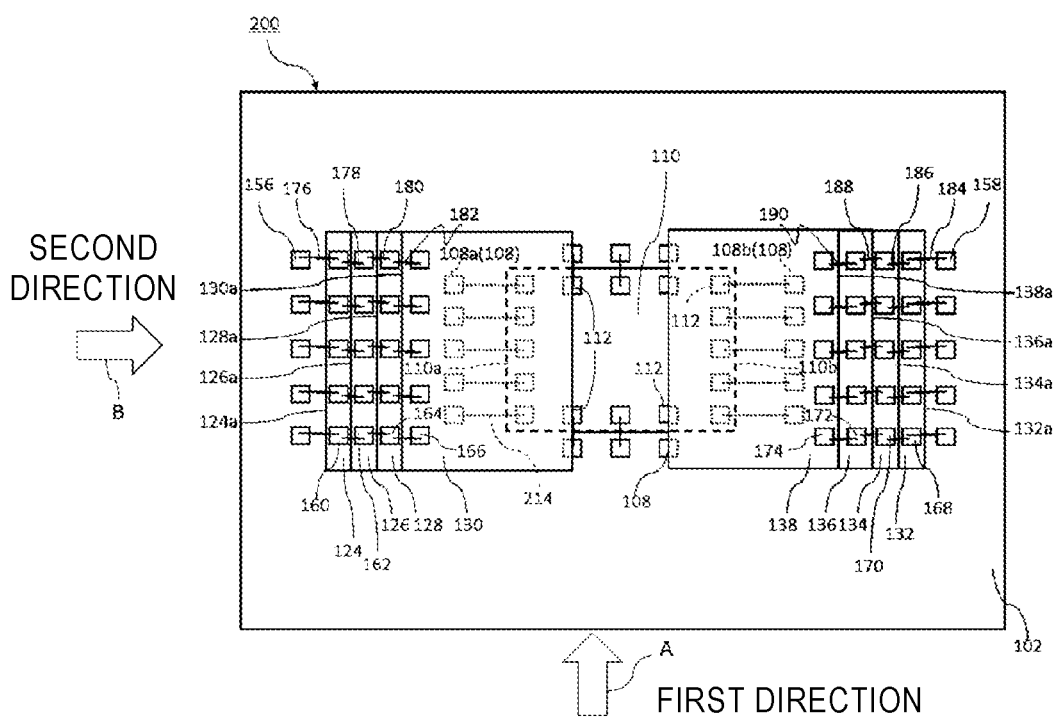
FIG. 11 is a schematic top plan view of a semiconductor device according to a second embodiment.
Figure 12:
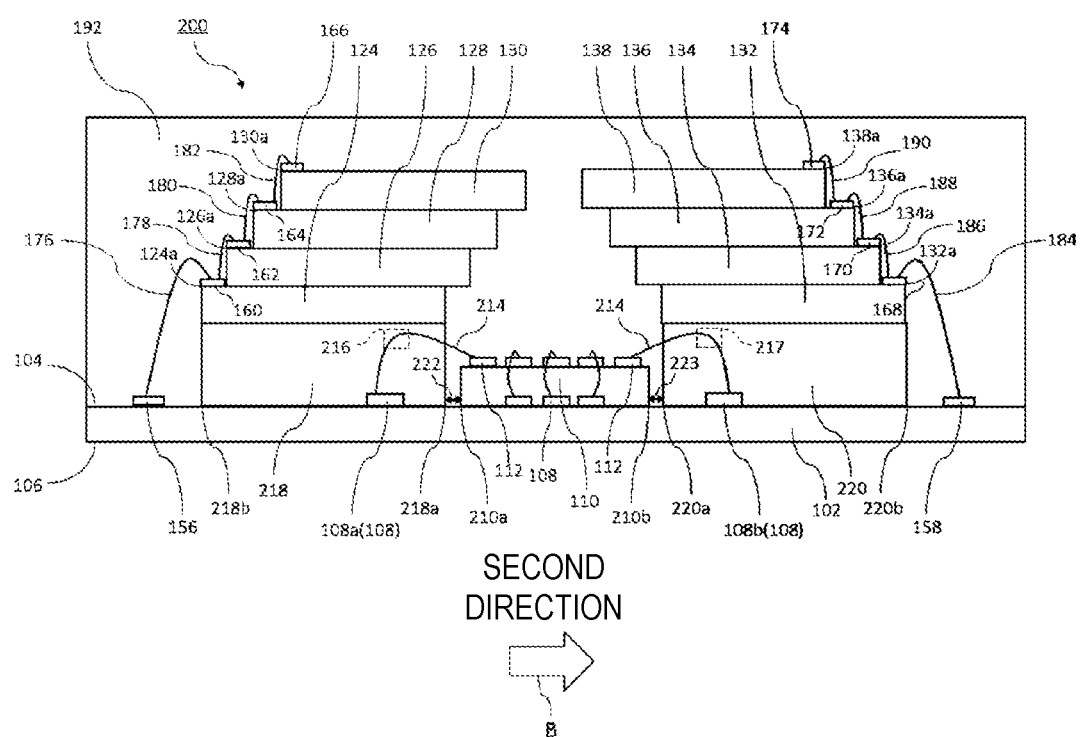
FIG. 12 is a schematic side view of a semiconductor device according to a second embodiment.

A configuration of the semiconductor device 200 will be described with reference to FIGS. 11 and 12. FIG. 11 is a schematic top plan view of the semiconductor device 200, and FIG. 12 is a side view of the semiconductor device 200 when viewed in the direction of arrow A illustrated in FIG. 11.

The highest points of the arcs 216 and 217 of the first connectors 214 are located outside the outer perimeter of the first semiconductor chip 110 when viewed from above, and the highest points of the arcs 216 and 217 are embedded in the adhesive resins 218 and 220, respectively.

The first connectors 214 are disposed so as not to be in contact with the second semiconductor chips 124 and 132.

The adhesive resins 218 and 220 are, for example, DAF having a thickness of about 60 μm, and may be thicker by about 10 to 20 μm than the first semiconductor chip 110.

The second embodiment shows a case in which the thicknesses of the adhesive resins 218 and 220 are greater than the heights of the highest points of the arcs 216 and 217.

The adhesive resins 218 and 220 are provided such that the gap 222 is formed between the adhesive resin 218 the first semiconductor chip 110, and the gap 223 is formed between the adhesive resin 220 and the first semiconductor chip. The gaps 222 and 223 preferably have a small size, and may be as narrow as possible so long as gap dimension can be filled with the molded resin 192. In view of this, the sizes for the gaps 222 and 223 are preferably at least 20 μm to allow filling by the molded resin 192.

The semiconductor device according to the second embodiment can be manufactured using substantially the same method as described above in conjunction with the first embodiment.

(Effect of Semiconductor Device According to Second Embodiment)

In the second embodiment, the highest points of the arcs 216 and 217 are located outside the outer perimeter of the first semiconductor chip 110 when viewed from above, and the highest points of the arcs 216 and 217 are respectively embedded in the adhesive resins 218 and 220.

Therefore, there is less concern that the first connectors 214 and the second semiconductor chips 124 and 132 will come in contact with one another when the adhesive resins 218 and 220 are placed close to the first semiconductor chip 110. That is, the sizes of the gaps 222 and 223 may be substantially reduced.

In addition, compared with the semiconductor device 100 according to the first embodiment, the semiconductor device 200 according to the second embodiment has possibly reduced size and thickness by the at least the amount that the first connectors 214 are embedded in the adhesive resins (218 or 220) along the second direction.

Further, the thicknesses of the adhesive resins 218 and 220 may be approximately equal to or about 10 to 20 μm thicker than a thickness which would just cover the highest points of the arcs 216 and 217. In addition, the thicknesses of the adhesive resins 218 and 220 are greater than the thickness of the first semiconductor chip 110.

Other Embodiments

Depicted examples in the figures have four second semiconductor chips which are stacked one on the other, but the number of stacked second semiconductor chips is not limited thereto. In general, any number of second semiconductor chips may be stacked one on the other.

In addition, FIGS. 1 to 12 illustrates examples in which only second semiconductor chips are stacked one on the other, but the stacked structure is not limited thereto. For example, additional adhesive resins or spacers may be interposed between the stacked semiconductor chips.

Further, FIGS. 1 to 12 illustrate examples in which one adhesive resin portion is provided on one side and a second adhesive resin portion is provided on another side opposite the first adhesive resin portion, but in some example adhesive resin could be provided only on one side.

The thickness of adhesive resin may be greater or less than the height of the apex of the first connector. Further, the apex may or may not be embedded in the adhesive resin.

FIGS. 1 to 12 illustrate examples in which all of the second connectors are connected to the second semiconductor chips (or the substrate) in a step/stage below, but the method for connecting the second connector is not limited thereto, so that for example the second connectors may be connected directly to the substrate from any step/stage height or may be connected to the substrate after connecting to one intermediate stage.

While certain embodiments have been described, these embodiments have been presented by way of example only, and are not intended to limit the scope of the present disclosure. Indeed, the novel embodiments described herein may be embodied in a variety of other forms; furthermore, various omissions, substitutions and changes in the form of the embodiments described herein may be made without departing from the spirit of the present disclosure. The accompanying claims and their equivalents are intended to cover such forms or modifications as would fall within the scope and spirit of the present disclosure.

What is claimed is:

1. A semiconductor device, comprising:
   a first terminal on a first surface of a substrate;
   a first semiconductor chip on the first surface and including a second terminal;
   a first connector electrically connecting the first terminal to the second terminal;
   a second semiconductor chip on the first surface of the substrate; and
   an adhesive resin between the second semiconductor chip and the first surface, a portion of the first connector being embedded in the adhesive resin, the first semiconductor chip being spaced from the adhesive resin in a direction parallel to the first surface, wherein the adhesive resin is in direct contact with the first surface.

2. The semiconductor device according to claim 1, wherein the substrate is a wiring substrate.

3. The semiconductor device according to claim 1, wherein the first connector is a bonding wire.

4. The semiconductor device according to claim 1, wherein the portion of the first connector includes an apex portion of the first connector.

5. The semiconductor device according to claim 1, wherein the portion of the first connector excludes an apex portion of the first connector.

6. The semiconductor device according to claim 1, wherein the second semiconductor chip is approximately identical in external shape to the adhesive resin when viewed from above.

7. The semiconductor device according to claim 1, further comprising:
   a plurality of second semiconductor chips stacked one on the other above the adhesive resin.

8. The semiconductor device according to claim 7, wherein the plurality of second semiconductor chips form a stair-step shape.

9. The semiconductor device according to claim 7, wherein an uppermost second semiconductor chip of the plurality of second semiconductor chips overlaps the second terminal when viewed from above.

10. The semiconductor device according to claim 1, further comprising:
    a molded resin encasing the first surface, the first semiconductor chip, the second semiconductor chip, the adhesive resin, and any portion of the first connector other than the portion embedded in the adhesive resin.

11. A semiconductor device, comprising:
    a plurality of first terminals on a first surface of a substrate; a first semiconductor chip on the first surface and including a plurality of second terminals;
    a plurality of first connectors each electrically connecting one first terminal of the plurality of first terminals to one second terminal of the plurality of second terminals;
    a first stack of second semiconductor chips on the first surface of the substrate, wherein an uppermost second semiconductor chip in the first stack overlaps the plurality of second terminals when viewed from above; and
    an adhesive resin between the first stack of second semiconductor chips and the first surface, a portion of each first connector being embedded in the adhesive resin, the first semiconductor chip being spaced from the adhesive resin in a direction parallel to the first surface.

12. The semiconductor device according to claim 11, further comprising:

a second stack of second semiconductor chips on the first surface of the substrate, the first semiconductor chip being on a portion of the first surface between the first stack and the second stack.

13. The semiconductor device according to claim 11, wherein the portion of each of the first connectors includes an apex portion of the respective first connector.

14. The semiconductor device according to claim 11, wherein the portion of each of the first connectors excludes an apex portion of the respective first connector.

15. The semiconductor device according to claim 11, wherein the first stack forms a stair-step structure.

16. A method for manufacturing a semiconductor device, the method comprising:

placing a first semiconductor chip on a first surface of a substrate, the first surface having a first terminal thereon, the first semiconductor chip including a second terminal thereon;

electrically connecting the first terminal and the second terminal with a first connector;

placing an adhesive resin on a surface of a second semiconductor chip, the adhesive resin and the second semiconductor chip having substantially a same shape and overlapping when viewed from above; and placing the second semiconductor chip on the first surface with the adhesive resin between the second semiconductor chip and the first surface, the first terminal and a part of the first connector being embedded in the adhesive resin, wherein the part of the first connector includes an apex portion of the first connector.

17. The method according to claim 16, wherein the second semiconductor chip is prepared by dicing a wafer to which the adhesive resin has been attached.

\* \* \* \* \*